United States Patent [19]

Tsubai et al.

[11] 4,230,792
[45] Oct. 28, 1980

[54] LITHOGRAPHIC PRINTING PLATE FROM SILVER HALIDE EMULSION

[75] Inventors: Yasuo Tsubai; Akio Yoshida; Shigeyoshi Suzuki, all of Nagaokakyo, Japan

[73] Assignee: Mitsubishi Paper Mills, Ltd., Tokyo, Japan

[21] Appl. No.: 811

[22] Filed: Jan. 4, 1979

Related U.S. Application Data

[63] Continuation of Ser. No. 812,893, Jul. 5, 1977, abandoned.

[30] Foreign Application Priority Data

Jul. 15, 1976 [JP] Japan .................................. 51-84164

[51] Int. Cl.$^2$ .................................. G03F 7/02
[52] U.S. Cl. .................................. 430/302; 101/456; 101/466; 101/467; 430/309; 430/421; 430/427; 430/432; 430/455; 430/949
[58] Field of Search .................. 96/29 L, 33, 59; 101/455, 456, 463, 466, 467; 430/302, 309, 421, 427, 432, 455, 949

[56] References Cited

U.S. PATENT DOCUMENTS

| T887,008 | 6/1971 | Yackel | 96/33 |
|---|---|---|---|
| 3,099,209 | 7/1963 | Damschroder et al. | 101/149.2 |
| 3,592,647 | 7/1971 | Blake et al. | 96/33 |
| 3,640,717 | 2/1972 | Gallet et al. | 96/59 |
| 3,721,559 | 3/1973 | DeHaes et al. | 96/33 |
| 3,745,013 | 7/1973 | Oni et al. | 96/33 UX |
| 3,989,522 | 11/1976 | Poot et al. | 96/33 |

*Primary Examiner*—Edward C. Kimlin
*Attorney, Agent, or Firm*—Cushman, Darby & Cushman

[57] ABSTRACT

The present invention provides a lithographic printing plate, which is made by exposing a photographic material having a silver halide photosensitive emulsion layer, developing the exposed material and treating the developed material with a conversion liquid comprising a solvent for a silver halide and an organic compound capable of forming a compound which is more stable and has a lower solubility than a soluble silver complex formed by said solvent.

20 Claims, No Drawings

LITHOGRAPHIC PRINTING PLATE FROM SILVER HALIDE EMULSION

This is a continuation of application Ser. No. 812,893 filed July 5, 1977, now abandoned.

BACKGROUND OF THE INVENTION

The present invention relates to a method of forming a lithographic printing plate from a silver halide photographic material, and more particularly to a lithographic printing plate in which a silver halide photographic image is made oleophilic and receptive to inks, and a method of forming the same.

A lithographic printing plate comprises an oleophilic image portion which is receptive to oily inks and an oil-repellent non-image portion which is not receptive to the inks. In general said non-image portion is receptive to water, i.e., hydrophilic.

A usual lithographic printing plate can be thus provided thereon with both water and ink. That is, an image portion is receptive to a coloring ink and a non-image portion receptive to water. Printing is effected by transferring the ink on the image portion onto a base such as paper. In order to make a good printing a great difference between the hydrophilicity of a non-image portion and the oleophilicity of an image portion is required, that is, when an ink is applied it is required that the image portion receives a sufficient amount of the ink and the non-image portion does not completely receive the ink. Various materials for such lithographic printing and methods of forming such printing plates are already known.

There are some requirements to small flexible printing plates for "small offset" printing used in offices. The production of these printing plates with ease, certainty and rapidity, preferably in an automatic manner is required. Prior printing plates consisting essentially of a sensitive aqueous colloid of a bichromate and a sensitive organic diazo colloid do not satisfy all of these requirements. Furthermore, they lack sensitivity in forming images by a direct optical projection.

Printing plates prepared by an electrophotographic process satisfy more of the requirements above but do not always have good reproduction of images and run strength.

A photographic material comprising a silver halide emulsion which is highly sensitive and spectrum-sensitizable is suitable for the automatic production of printing plates, and it has been used in some forms.

Typical known methods for forming lithographic printing plates by using a photographic gelatin-silver halide emulsion are as follows:

(1) a method in which a hydrophilic gelatin-silver halide emulsion is subjected to the tanning development and the developed portion of gelatin is cured to be oleophilic and receptive to inks (cf. U.S. Pat. No. 3,146,104), (2) a method utilizing the silver complex diffusion transferring in which the formed superficial pattern of metallic silver or silver complex image is converted to be oleophilic and receptive to inks (cf. U.S. Pat. Nos. 3,721,559, 3,490,905, 3,063,837, and 3,728,114, DAS No. 1,116,536 and Journal of Photographic Science 8, 26–32, 1960, A. Rott & L. DeHaes), (3) a method in which developed silver images or silver images formed by the transferring development are treated with a bleaching solution using etching bleach and simultaneously gelatin at the silver pattern is destroyed to expose an oleophilic surface (cf. U.S. Pat. No. 3,385,701, U.S. Pat. No. 3,814,603 and Japanese Patent Publication No. 27242/69), and (4) a method in which an undeveloped silver halide portion in a hydrophilic gelatin-silver halide emulsion layer developed is selectively converted to be oleophilic and receptive to inks (cf. U.S. Pat. Nos. 3,454,398, 3,764,323 and 3,099,209).

However, these roughly classified methods have problems in constructions of materials or treatment originating from their principles and mechanism. For example, the printing plate shown in (1) which utilizes curing phenomenon must be treated with a developing solution containing no or a little amount of sulfite to cause the problem of reduction in image quality due to diffusion of oxides of the tanning developing agent. In the case of the method (2) which utilizes silver complex diffusion transfer process, generally the developing treatment of a high alkalinity is required, fluctuations in characteristics such as sensitivity often occur when a great number of printing is carried out and moreover there are technical limitations when automatic plate making is carried out by contact transfer method (light sensitive material and printing material are separate materials). According to the method (3) which utilizes etching bleach, a large amount of sludges occur during the treatment to make it difficult to obtain stable characteristics and moreover there has been a problem in the preservation of treating machines.

The lithographic printing plate of the present invention belongs to the field of the method (4). That is, in the case of printing plate where undeveloped silver halide image portion is made ink receptive, the so-called ordinary developing treatment can be applied, the characteristics obtained by the treatment are stable and moreover since light sensitive material and printing plate are the same it becomes easy to carry out automatic treatment.

In a method of forming a lithographic printing plate by converting an image of undeveloped silver halide to be oleophilic, there has been proposed, for example, the treatment with an alkaline solution of a thiol compound (cf. U.S. Pat. No. 3,099,209), a terminal ethynyl compound (cf. U.S. Pat. No. 3,454,398) or an alkaline solution containing a benzotriazol compound (cf. U.S. Pat. No. 3,764,323). However, these prior treatments all have such defects that the receptivity of inks are too poor to produce a copy of sufficient density, long periods of time are required for permitting images to receive an ink or ink-receptive portions are worn out before a number of copies is produced.

SUMMARY OF THE INVENTION

The first object of the present invention is to provide a method of forming printing plates, said method having no such defects. Another object is to provide a method in which not a diffusion transfer developers, but the ordinary photographic developers can be used and printing plates can be formed with ease and rapidity.

DESCRIPTION OF THE INVENTION

Other objects, characteristics and advantages of the present invention will be clear from the explanation below.

The present invention provides a novel method of forming a lithographic printing plates, in which a material having a photosensitive silver halide emulsion layer is exposed imagewise to light and subjected to the normal photographic development, and then a remaining silver halide image, i.e., which was not reduced by the development is converted to be oleophilic by a novel process.

The process comprises contacting the light-exposed and developed silver halide material with a fixing composition liquid (hereinunder referred to as a conversion liquid) containing (a) an organic compound capable of forming a soluble compound by reaction with silver ions, and (b) a solvent for a silver halide.

The organic compounds particularly useful for practice of the present invention are heterocyclic compounds having or not having a thiol group or a thion group as a backbone.

A wide variety of said organic compounds may be used, particularly compounds of the following formula are preferred:

R—SH         (I)

wherein R is an alkyl group having at least 10 carbon atoms, aryl group or aralkyl group.

Typical examples are dodecanthiol, octadecanthiol and etc.

Examples of 5- or 6-membered heterocyclic compounds having a formula

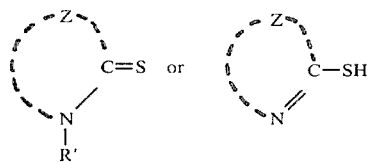

(II)

wherein R' is hydrogen, or an alkyl group having not more than 12 carbon atoms, aryl group or aralkyl group, and Z is atomic group required for forming a 5- or 6-membered heterocyclic compound together with N and C, are imidazole, imidazoline, thiazole, thiazoline, oxazole, oxazoline, pyrazoline, triazole, thiadiazole, oxadiazole, tetrazole, pyridine, pyrimidine, pyridazine, pyrazine, triazine, and etc. Furthermore, these rings may be two or more formed by condensation or formed by condensation with a benzene ring or naphthalene ring which may have a substituent. Typical examples of the compounds represented by formula (II) are 2-mercapto-4-phenylimidazole, 2-mercapto-1-benzylimidazole, 2-mercapto-benzimidazole, 2-mercapto-1-ethyl-benzimidazole, 2-mercapto-1-butylbenzimidazole, 1,3-diethyl-benzimidazoline-2-thione, 2,2'-dimercapto-1,1'-decamethylene-diimidazoline, 2-mercapto-4-phenylthiazole, 2-mercapto-benzothiazole, 2-mercaptonaphtothiazole, 3-ethyl-benzothiazoline-2-thione, 3-dodecylbenzothiazoline-2-thione, 2-mercapto-4,5-diphenyloxazol, 2-mercaptobenzooxazol, 3-pentylbenzooxazoline-2-thione, 1-phenyl-3-methyl-pyrazoline-5-thione, 3-mercapto-4-allyl-5-pentadecyl-1,2,4-triazole, 3-mercapto-5-nonyl-1,2,4-triazole, 2-mercapto-5-phenyl-1,3,4-thiadiazole, 2-mercapto-5-phenyl-1,3,4-oxadiazole, 2-mercapto-1,3,4-oxadiazol, 2-mercapto-5-methyl-1,3,4-oxadiazol, 2-mercapto-5-ethyl-1,3,4-oxadiazol, 2-mercapto-5-propyl-1,3,4-oxadiazol, 2-mercapto-5-hexyl-1,3,4-oxadiazol, 2-mercapto-5-heptyl-1,3,4-oxadiazol, 3-mercapto-4-benzamide-1,2,4-triazole, 3-mercapto-4-phenylacetamide-5-methyl-1,2,4-triazole, 3-mercapto-4-amino-5-phenyl-1,2,4-triazole, 3-mercapto-4-toluenesulfonamide-5-phenyl-1,2,4-triazole, 3-mercapto-4-acetamino-5-heptyl-1,2,4-triazole, 3-mercapto-4-benzamide-5-heptyl-1,2,4-triazole, 3-mercapto-4-phenylacetamide-5-heptyl-1,2,4-triazole, 3-mercapto-4-amino-5-nonyl-1,2,4-triazole, 3-mercapto-4-acetamino-5-nonyl-1,2,4-triazole, 3-mercapto-4-acetamino-5-pentadecyl-1,2,4-triazole, 3-mercapot-4-amino-5-heptadecyl-1,2,4-triazole, 3-mercapto-4-acetamino-5-heptadecyl-1,2,4-triazole, 5-mercapto-1-phenyltetrazole, 2-mercapto-5-nitropyridine, 1-methylquinoline-2(1H)-thione, 2-mercapto-4-hydroxy-6-pentadecylpyridine, 3-mercapto-4-methyl-6-phenylpyridazine, 2-mercapto-5,6-diphenyl-pyrazine, 2-mercapto-4,6-diphenyl-1,3,5-triazine, 2-amino-4-mercapto-6-benzyl-1,3,5-triazine, 1,5-dimercapto-3,7-diphenyl-S-triazolino[1,2-a]-S-triazoline, and etc. Particularly a group of compounds having formula (III) or (IV) provides excellent effects,

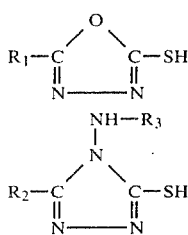

wherein $R_1$ and $R_2$ are hydrogen, an alkyl group, aryl group or aralkyl group, and $R_3$ is hydrogen, an acyl group or arylsulfonyl group.

However, the organic compounds used in the present invention do not necessarily have to contain a thiol group or thion group in their molecules. The organic heterocyclic compounds of the formula (II) above having a sulfur atom if any in its ring alone such as imidazole, imidazoline, thiazole, thiazoline, oxazole, oxazoline, pyrazoline, triazole, thiadiazole, oxadiazole, tetrazole, pyridine, pyrimidine, pyridazine, pyrazine, triazine, etc. are also advantageous, but generally use of these compounds alone requires a long period of time for ink up. However, the use of these compounds together with a thiol compound or a thion compound improves an ink reception property and a running strength over use of these compounds alone.

The quantities of said organic compounds effective for achieving the objects of the present invention are not always identical with one another, but they are within the range of about 0.01 to 10 g/l. These organic compounds may be used singly or in combination. Particularly, as mentioned above, the use of at least one compound selected from the group of the compounds having a thiol or thion group in combination with at least one selected from a group of said organic heterocyclic compounds having no sulfur atom in moieties other than their cyclic moiety is effective to improve an ink up property and a running strength. As another element of the present invention there is used a solvent for silver halides, which may be sulfites, thiosulfates, or thiocyanates, preferably alkali metal salts or ammonium salts thereof. Furthermore, compounds releasing halogen ions in an aqueous solution may be effective to the present invention. Such compounds are chlorides, bromides or iodides, preferably soluble salts of an alkali metal such as sodium or potassium, or ammonium. It is known that a silver halide is complexed with an excess of halogen ions present to be soluble ("Photographishe Korrespondenz", 92 139, 1959). Particularly bromide ions and iodide ions cause a silver halide to be highly solubilized. Preferred quantities of these solvents for silver halides used vary depending upon halogen contents, solubilizability of the solvents and a kind of the organic compounds used, but $10^{-1}$ mol/l–$10^0$ mol/l of the sulfites, $10^{-2}$ mol/l–$2\times10^{-1}$ mol/l of the thiosulfates and $10^{-2}$ mol/l–$5\times10^{-1}$ mol/l of the thiocyanates are effective. Sodium chloride is effective only to a printing plate having a silver halide emulsion containing a small amount of bromide ions or no bromide ions. The effective quantity of sodium chloride used is within the range of $10^{-1}$ mol/l–3 mol/l. For potassium bromide it is within the range of about $10^{-2}$ mol/l–2 mol/l and for potassium iodide within the range of $10^{-2}$ mol/l–1 mol/l. Furthermore, ammonia; amines such as monoethanolamine, diethanolamine, triethanolamine, diethylenetetramine or triethylenepentamine; imines such as polyethyleneimines; and thiourea and derivatives thereof are effective to the solubilization of silver halides, and they may be used in the present invention. Particularly thiourea and its N-mono- or N,N'-di-substitution product are useful as the solvent. For example, alkyl-substituted, aryl-substituted and amino-substituted thioureas, and cyclic ethylenethiourea are effective. Among these solvents for silver halides, thiocyanates, soluble iodides, thiourea and derivatives thereof are especially effective. These solvents for silver halide may be used singly or in combination. Particularly the use of a iodide such as potassium iodide together with a thiocyanate, thiourea, its N-mono- or N,N'-di-substitution product, a bromide or a thiosulfate is effective to the improvement of an ink up property and a running strength.

A conversion liquid containing an organic compound for making a printing plate oleophilic and a solvent for silver halide may contain an organic solvent which is compatible with water and improves the solubility of said organic compound. As the solvent, there may be used, for example, methanol, ethanol, propanol, isopropanol, ethylene glycol or glycerine. Furthermore, the conversion liquid is preferably buffered at a pH value between 4 and 8, because strong alkalis react with a free fatty acid in a printing ink to form a soap and cause emulsification of ink and water during printing. When a pH value is too low, a printing machine is undesirably attacked. A substance for buffering said liquid at the desired pH value includes an organic acid such as acetic acid or citric acid and an inorganic acid such as phosphoric acid, sulfurous acid or boric acid. Furthermore, said conversion liquid may contain various other components, for example, cellulose derivatives such as hydroxymethylcellulose or cellulose-sulfuric acid ester; water-soluble polymers such as polyvinyl alcohol and its derivatives; an agent for making a surface hydrophilic, such as colloidal silica; and/or a colloid hardening agent for preventing the warping of colloids during printing, such as an organic colloid hardening agent such as formalin, glyoxal, glutaraldehyde or tannic acid or an inorganic colloid hardening agent such as chromium or aluminum.

As mentioned above, it is well known that a heterocyclic compound such as a thiol compound or benzotriazole is reacted with silver halide images to make the images receptive to inks, but surprisingly it has been found that the present invention obtains unexpected advantages by using the solvent for silver halides according to the present invention in addition to said compounds.

In a usual gelatin-silver halide photographic emulsion layer, silver halide particles are present in a form dispersed in a gelatin as a binder are exposed on the surface of the layer. Therefore, when said organic heterocyclic compounds alone were applied directly to the surface only a small amount of said organic compounds would be placed on or in the vicinity of the surface. Hydrophilic colloids act as an ink repellant in printing. The resulting oleophilicity and ink receptivity would be poor due to the competition with the ink repellency by the hydrophilic colloids. It is deduced that the advantages of the present invention would result from the formation of a dense ink receptive layer by adding a solvent for silver halides, and this layer would be formed by dissolving silver halides particles present in the hydrophilic colloid layer and efficiently reacting silver ions in the silver halides with the organic compound, or by dissolving silver halide particles, which diffuse on or in the vicinity of the surface and react with said organic compound to form a sparingly soluble silver compound. U.S. Pat. No. 3,063,837 discloses a method for producing a printing plate which comprises forming a silver complex image on an image receiving material (printing plate) utilizing silver diffusion transfer process and then making the image ink receptive with mercapto compounds. However, one of the defects of this method is that it is difficult to obtain good ink receptivity and image intensity as compared with the method of the present invention.

By the solvent for silver halides according to the present invention is meant a compound capable of reacting with the silver halides to form a complex having a higher solubility than that of the silver halides. By the organic compound of reacting with silver ions to form a sparingly soluble compound according to the present invention is meant an organic compound capable of forming a compound having a higher stability and lower solubility than those of a soluble silver complex formed by the solvent for silver halides.

As easily expected, a solution containing said organic compound and another solution containing said solvent for silver halides may be separately applied. However, the best result can be obtained when the two are simultaneously applied.

According to the present invention, it is not a portion of a photographic material corresponding to metallic silver images but a remaining portion containing undeveloped silver halides that is made receptive to inks. Thus, a negative silver halide photographic material is exposed, developed and then treated with the conversion liquid according to the present invention to make a positive printing plate. A negative printing plate can be made directly from a positive silver halide material.

In another embodiment of the present invention, the silver halide images may be made receptive to inks by the method of the present invention, after the silver halide photographic material was developed and then fixed, or after said material was developed and fixed in a monobath and the remaining silver images oxidized to be rehalogenated. The photographic material comprising a silver halide emulsion used in the present invention is silver chloride, silver chlorobromide, or silver bromide and these may contain iodides. As a binder gelatin is preferred. However, it may be replaced partially or wholly by other colloidal substances such as albumin, casein, polyvinyl alcohol, polyvinyl alcohol-maleic anhydride ester, polyvinyl alcohol-styrene maleic anhydride ester, alginates or cellulose derivatives.

The absolute quantity of the binder and the weight ratio of the binder to the silver halide are essential or critical to the quality of the printing plate made according to the present invention. The weight ratio of the binder to the silver halide when calculated as silver nitrate is suitably within the range of 0.3 to 2.0. When said ratio is below 0.3, the strength of a film as an emulsion layer is readily reduced so that good printing is not obtained. On the other hand, when said ratio is higher the ink receptivity may be reduced. The silver halide emulsion layer is preferably coated in an amount of 0.6 to 7 g/m$^2$ as calculated in terms of silver nitrate or in an amount of 0.5 to 2.5 g/m$^2$ as calculated in terms of the binder.

Another factor essential to the preparation of the printing plate according to the present invention is a hardened film of the photosensitive silver halide emulsion layer. The film should be adequately hardened at least before applying a printing ink. A hardening agent may be added to a photographic emulsion coating solution as in a usual manner for hardening a film of a photographic emulsion layer, or the film may be hardened by, for example, heat treatment before or after development and plate-making. In order to obtain a stable hardness, a moderate heat treatment is desired after applying a silver halide emulsion containing a hardening agent and drying. This heat treatment may be carried out, for example, at 80°–150° C. for some ten minutes or at 30°–50° C. for several days (about 1–20 days) to obtain a good hardness.

The hardening agent used in the present invention may be the same as that used in the usual photosensitive emulsion layer. That is, as the hardening agent there may be used one or more of the well-known compounds, i.e., aldehydes such as formalin, glyoxal, glutaraldehyde or mucochloric acid; urea-formalin condensate; melamine-formalin condensate; epoxy compounds; aziridine compounds; active olefins; or isocyanates and furthermore inorganic salts of polyvalent metals such as chromium, aluminum or zirconium.

The silver halide emulsion layer may contain fine particles having a particle size of about 2–10 microns to prevent colloid from wearing during printing. As such particles there may be used silica, clay, talc, or rice starch, particularly silica is preferred. Silica is added in an amount of 0.01 to 1.0 g/m$^2$ to a silver halide emulsion. If the density of silica particles is excessive, an ink concentration is hardly raised and scumming occurs during printing. For the purpose of improving the sharpness of a photograph and finally the resolving power and sharpness of print, so-called reflection inhibiting dyes or pigments are preferably applied. The purpose can be achieved by introducing these into a silver halide emulsion layer, a reflection inhibiting layer between a support and the silver halide emulsion layer, the substrate or a layer on the opposite side of the substrate to the silver halide emulsion layer. Reflective pigments, e.g., white pigments such as titanium oxide, barium sulfate and magnesium oxide or yellow organic pigments may be used in combination with light-absorbing dyes or pigments.

In the optimum embodiment, the photosensitive material used in the present invention comprises a colloid undercoating layer containing a reflection inhibiting dye or pigment on a substrate and a photosensitive silver halide emulsion layer on said undercoating layer.

Said colloid undercoating layer containing a reflection inhibiting dye or pigment is made of gelatin containing fine particles having a particle size of 2–10 microns as mentioned above. Silica is properly used as such fine particles. Gelatin as a binder is in an amount of 0.5–2.5 g/m$^2$ and should be suitably hardened as the silver halide emulsion layer. Silica is applied in an amount of 0.1–2.0 g/m$^2$.

Applying such undercoating layer containing fine particles as in the present invention improves the abrasion of colloids during printing and, as a result, the running strength. In this case, fine silica particles are not necessarily to be contained in the emulsion layer.

A substrate for a photosensitive silver halide emulsion may be any material usually used in the art. For example, it is a paper or resin film or a metal sheet. A paper substrate is preferably coated at both the sides thereof with a resin such as polyethylene. Such substrate may be beforehand subjected to the corona discharging process or the hydrophilic undercoating process for the purpose of improving the adhesiveness between the substrate and the coating layer consisting essentially of gelatin.

Fundamental explanations have been made above with respect to the lithographic printing plate and the method of making the same according to the present invention. Furthermore, other agents such as a surface active agent for improving a coating property, a stabilizing agent for maintaining a photosensitivity, an antifogging agent, a spectrum sensitizing agent, a developer, a development promoting agent and a dye or pigment for coloring a photosensitive silver halide emulsion layer, may be optionally contained in the photosensitive silver halide emulsion layer.

In a modified embodiment of the present invention part or the whole of the organic thiol compound, thion compounds or other organic heterocyclic compounds may be beforehand added to the materials including the silver halide emulsion layer or the other layers. These organic compounds may be added in a form of an oil dispersion in which said compounds are finely dispersed.

The exposure may be carried out in an usual manner such as contact printing, reflection or projection.

An exposed silver halide emulsion layer can be developed by a photographic developer consisting primarily of p-dihydroxybenzene usually used or by a lith-type developer containing a slight amount of sulfites. Furthermore, it is also possible that a developer is contained in a photosensitive material, which is treated with an activator mainly comprising an alkali solution.

In a preferred embodiment, an exposed and developed material is treated with the conversion liquid according to the present invention. The thus obtained printing plate can be used immediately as it stands in a printing machine. This plate can be stored for a long period of time without applying inks.

In another embodiment, after developing the material may be treated with such an acidic stopper as usually used, and then, with the conversion liquid according to the present invention.

The most useful process is to use a completely automatic exposing apparatus. For example, Silver Master System CP-404 Full Automatic Plate Making Apparatus (tradename ex. Mitsubishi Paper Mills Co., Ltd.) may be used.

In this apparatus, a material is fed in a roll form and is cut in any length after exposure. Then it is developed in a first bath, and treated in a second bath of the conversion liquid according to the present invention. The development in the first bath is normally carried out at 20°–35° C., but may be carried out at a higher temperature. The development time varies depending upon a development temperature. Normally, it is adequately 15 seconds at 30° C. The treatment in the second bath with the conversion liquid is normally carried out at room temperature (18°–25° C.). The treatment time in said second bath has a smaller influence on printing properties and is adequately between 5 and 20 seconds. Thus, the thus-treated printing plate can be squeezed by a rubber roller to remove an excess of the liquid and set in a printing machine for printing. Furthermore, another merit of the printing plate according to the present invention is that images can easily be corrected and erased.

The liquids as disclosed in Japanese Patent Publication No. 15761/76 and Japanese Kokai (Open to Public Inspection) No. 21901/76, i.e., which contain an organic compound having at least one mercapto or thion group and at least one hydrophilic group in the same molecule, can also be used in the present invention.

The following examples are intended to be illustrative of the present invention without necessarily being exclusive or wholly definitive thereof.

EXAMPLE 1

A gelatin under coating liquid containing silica particles (an average particle size of 5 microns) and carbon black was applied onto a polyethylene coated paper which had been subjected to the corona discharging process. As a colloid hardening agent formalin and dimethylolurea were added. The gelatin and silica were applied in amounts of 1.2 g/m$^2$ and 0.7 g/m$^2$, respectively. The resulting layer had a reflective density of 0.9 at 500 m$\mu$. On the undercoat layer was applied an orthosensitized silver halide emulsion of high contrast containing formalin and dimethylolurea. After drying the product was heat treated at 40° C. for 2 days. The emulsion layer had the following constructions.

| silver halide composition: | silver chlorobromide (25 mol % silver bromide) |
|---|---|
| average particle size of silver halide: | 0.33 $\mu$ |
| coating rate of silver halide as calculated in terms of silver nitrate: | 1.2 g/m$^2$ |
| coating rate of gelatin: | 0.7 g/m$^2$ |
| coating rate of silica (an average particle size: 5 $\mu$): | 0.1 g/m$^2$ |

The thus obtained photosensitive material was optically exposed through a process camera having an image-reversing mirror.

The exposed material was developed at 25° C. for 30 seconds in a D72 developer. An excessive amount of the developer was removed by squeezing, and then immersed at 25° C. for 30 seconds in a conversion liquid having the following composition, squeezed and dried to obtain a printing plate.

| Water | 600 ml |
|---|---|
| potassium thiocyanate | 20 g |
| citric acid | 10 g |
| sodium citrate | 35 g |
| 2-mercapto-5-propyl-1,3,5-oxadiazol | 1.0 g |
| isopropyl alcohol | 200 ml |
| water to make up 1 l | |

This printing plate was placed in an offset printing machine, i.e., A. B. Dick 350CD (tradename). The surface of said plate was wetted with water. Then the machine was operated to obtain more than 5,000 clear copies.

EXAMPLE 2

Example 1 was repeated except that a conversion liquid having the following composition was used.

| Water | 600 ml |
|---|---|
| potassium iodide | 30 g |
| 2-mercapto-5-propyl-1,3,5-oxadiazole | 1.0 g |
| isopropyl alcohol | 200 ml |
| citric acid | 10 g |
| sodium citrate | 35 g |
| water to make up 1 l | |

As in Example 1, more than 5,000 clear copies were obtained.

EXAMPLE 3

Example 1 was repeated except that a conversion liquid having the following composition was used.

| water | 600 ml |
|---|---|
| potassium iodide | 20 g |
| thiourea | 1 g |
| ammonium primary phosphate | 25 g |
| sodium hydroxide | added to obtain a pH value of 6.0 |
| 3-mercapto-5-nonyl-1,2,4-triazole | 0.7 g |
| benzimidazole | 2.0 g |
| isopropyl alcohol | 300 ml |
| water to make up 1 l | |

More than 10,000 clear prints having a high image density were obtained.

EXAMPLE 4

Example 1 was repeated except that a conversion liquid having the following composition was used.

| water | 600 ml |
|---|---|
| sodium thiosulfate | 10 g |
| sodium sulfite | 2 g |
| ammonium primary phosphate | 25 g |
| 2-mercapto-1,3,5-oxadazol | 1 g |
| ethylene glycol | 200 ml |
| water to make up 1 l | |

500 Clear prints could be obtained.

EXAMPLE 5

Example 1 was repeated except that the resulting plate was once treated with liquid A, squeezed and dried, the plate was placed in a printing machine and entirely wetted with absorbent cotton impregnated with liquid B and then printing was effected.

| Liquid A | |
|---|---|
| ammonium primary phosphate | 20 g |
| potassium iodide | 20 g |
| water to make up 1 l | |
| Liquid B | |
| water | 600 ml |
| citric acid | 1 g |
| sodium citrate | 3.5 g |
| 2-mercapto-5-heptyl-1,3,5-oxadiazol | 1.0 g |
| isopropyl alcohol | 300 ml |

The resulting plate had a good ink up property, and 2,000 clear prints could be obtained.

EXAMPLE 6

Example 5 was repeated except that a liquid having the following composition was used in place of the liquid A above.

| | |
|---|---|
| ammonium primary phosphate | 20 g |
| thiourea | 1 g |
| potassium iodide | 20 g |
| water | 1 l |

The resulting plate had a good ink up property. More than 5,000 printed copies were all clear.

EXAMPLE 7

The same undercoat as in Example 1 was applied on a substrate. On the undercoat there was applied a highly sensitive direct positive emulsion which had been ortho-sensitized. The product was dried, and then heat treated at 40° C. for 2 days. The emulsion layer was constituted by:

| | |
|---|---|
| silver halide composition: | iodobromide (silver iodide 1 mol %) |
| average particle size of silver halide: | 0.25 μ |
| coating rate of silver halide as calculated in terms of silver nitrate: | 2.2 g/m² |
| coating rate of gelatin | 1.6 g/m² |

The thus-obtained photographic material was set in a microprinter and exposed through a negative microfilm.

The exposed photographic material was developed in D72 developer containing 0.5 g/l of 1-phenyl-3-pyrazolidone at 25° C. for 30 seconds, was dipped in a stopper of 1.5% acetic acid at room temperature for 10 seconds, was washed with water for 5 seconds and was dried.

The thus obtained printing plate was set in a printing machine and then the entire surface thereof was wiped with a conversion liquid having the following composition. Then printing was carried out.

| | |
|---|---|
| water | 600 ml |
| potassium iodide | 20 g |
| N-ethyl thiourea | 5 g |
| benztriazole | 1 g |
| 3-mercapto-4-acetoamide-5-n-heptyl-1,2,4-triazole | 1 g |
| isopropyl alcohol | 300 ml |

| | |
|---|---|
| ammonium primary phosphate | 3 g |

A great number of clear printings having a good ink-up property were produced.

EXAMPLE 8

On a polyethulene terephthalate film substrate having a backing layer there was applied a lith-type emulsion which has been ortho sensitized. Silver halide particles in the lith-type emulsion were comprised of 23 mol % silver bromide and 0.6 mol % silver iodide, and the remainder being silver chloride. The average particle size of the particles was 0.3 micron. The coating rate of the silver halides as calculated in terms of silver nitrate was 4.8 g/m² and the coating rate of gelatin was 3.2 g/m². Furthermore, the emulsion layer contained silica particles having an average size of about 5 microns. The amount of silica particles was 0.6 g/m². Said layer contained formalin and chromium as a hardening agent.

The thus-obtained photographic material was contacted with a halftone positive having dot image and exposure was carried out. The development was then effected at 20° C. for 2 minutes in the following developer.

| | |
|---|---|
| water | 500 ml |
| anhydrous sodium sulfite | 30 g |
| p-formaldehyde | 7.5 g |
| acidic sodium sulfite | 2.2 g |
| boric acid | 7.5 g |
| hydroquinone | 22.5 g |
| potassium bromide | 1.6 g |
| water to make up 1 l | |

The developed material was immersed into a solution having the following composition at room temperature for one minute.

| | |
|---|---|
| water | 1 l |
| ammonium primary phosphate | 10 g |
| sodium hydroxide | added to obtain a pH value of 6.5 |
| formalin (37%) | 10 ml |

Subsequently said material was placed in a heat treating apparatus having an infrared heater at 120° C. for one minute.

The thus-obtained printing plate had a high film strength. This plate was set in a printing machine and then was wiped over the entire surface thereof with the conversion liquid as shown in Example 3. The printing was carried out with a good reproduction of a halftone image, and a great number of clear printings was obtained.

Moreover, color printing could be carried out by the present invention using color separated halftone positives.

EXAMPLE 9

As shown in Example 1, a silver halide emulsion containing hydroquinone and 1-phenyl-3-pyrazolidone was applied to a gelatin undercoat layer containing a reflection inhibiting pigment and silica. This emulsion was an ortho-sensitized and high contrast chlorobromide emulsion (5 mol % silver bromide) and contained formalin and dimethylolurea as a colloid hardening agent. In the emulsion, the average particle size of silver halide was 0.25 micron, the coating rate of silver halide as calculated in terms of silver nitrate was 0.98 g/m², and the coating rates of gelatin, hydroquinone and 1-phenyl-3-pyrazolidone were 1.2 g/m², 0.4 g/m² and 0.01 g/m², respectively. The applied emulsion was dried and then heated at 40° C. for 6 days to harden the applied layer.

The thus obtained photosensitive material was exposed to produce an image and developed in the following active liquid at 25° C. for 8 seconds.

| sodium hydroxide | 25 g |
|---|---|
| sodium sulfite | 50 g |
| potassium bromide | 2 g |
| water to make up 1 l | |

An excess of the liquid was squeezed and then said material was treated with the conversion liquid as shown in Example 3 to obtain a printing plate.

A great number of clear printings was produced.

EXAMPLE 10

An image was enlarged and printed through a negative microfilm onto the photosensitive material as produced in Example 1. Said material was then subjected to a normal photographic treatment (D72 Development and F5 Fixing) and washed with water. Further, it was treated with a bleaching solution having the following composition, washed with water and dried.

| water | 1000 ml |
|---|---|
| potassium ferricyanide | 30 g |
| potassium iodide | 20 g |

Silver iodide was formed at a portion corresponding to the image portion of the material obtained, which portion exhibited yellowish white color. On the other hand, silver halide was removed and gelatin substantially retained at a portion corresponding to the non-image portion. The material was set in a printing machine and then wiped with a conversion liquid having the following composition.

| water | 900 ml |
|---|---|
| thiourea | 2 g |
| 2-mercapto-1,3,5-oxadiazole | 1 g |
| citric acid | 2 g |
| sodium citrate | 6 g |
| ethylene glycol | 50 ml |

A great number of clear printing were obtained.

This example confirmed that a negative printing plate could be made even when fixed and bleached.

What is claimed is:

1. In a method for making a lithographic printing plate, which comprises exposing a photosensitive material including a silver halide emulsion layer, and developing the exposed material, the improvement comprising making an undeveloped silver halide portion of said silver halide emulsion layer receptive to oleophilic inks by treating the developed material either (1) simultaneously with at least one solvent for silver halides and at least one organic mercapto or thion compound selected from the group consisting of compounds having the formulae (I), (II) and (III):

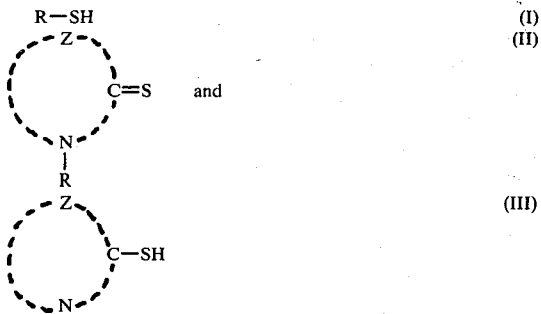

wherein R is alkyl having at least 10 carbon atoms, aryl or aralkyl group R' is hydrogen, an alkyl having not more than 12 carbon atoms, aryl or aralkyl group, and Z is an atomic group required to form a 5- or 6-membered heterocyclic compound together with N and C in the formulae, or (2) successively, first with said solvent and second with said organic mercapto or thion compound, said organic mercapto or thion compound being capable of forming a compound which is more stable and has a lower solubility than a soluble silver complex formed by said solvent to make an undeveloped silver halide portion receptive to oleophilic inks.

2. The method of claim 1 including treating the developed material first with at least one solvent for silver halides and second with at least one organic mercapto or thion compound.

3. The method according to claim 1, in which the compound of the formula (III) is at least one selected from the group consisting of:

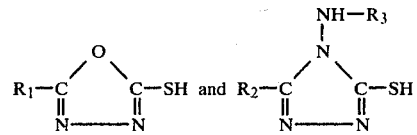

wherein $R_1$ and $R_2$ are hydrogen, an alkyl, aryl or aralkyl group, and $R_3$ is hydrogen, an acyl or arylsulfonyl group.

4. The method according to claim 1, in which the solvents for silver halides are soluble thiocyanates.

5. The method according to claim 1, in which the solvents for silver halide are thiourea.

6. The method according to claim 5, in which thiourea is at least one selected from the group consisting of N-monosubstitution and N,N'-disubstitution products.

7. The method according to claim 1, in which the solvents for silver halides are soluble iodides.

8. The method according to claim 1, in which the solvents for silver halides are at least one selected from the group consisting of soluble bromides and chlorides.

9. The method according to claim 1, in which the solvents for silver halides are combinations of at least two compounds selected from the group consisting of soluble thiosulfates, soluble thiocyanates, thiourea, N-monosubstitution and N,N'-disubstitution products of thiourea, soluble iodides, soluble bromides and soluble chlorides.

10. The method according to claim 9, in which the solvents for silver halides are combinations of at least one of the soluble iodides with at least one selected from the group consisting of soluble thiocyanates, thiourea, N-monosubstitution and N,N'-disubstitution products of thiourea, soluble bromides and soluble thiosulfates.

11. The method according to claim 1, in which at least one organic heterocyclic compound having no sulfur atom in moieties other than its cyclic moiety is used in combination.

12. The method according to claim 1, in which a solution of an organic mercapto or thion compound and a solvent for silver halide buffered at a pH value of 4–8 is used.

13. The method according to claim 1, in which the silver halide photographic material includes an undercoat layer containing fine particles having a particle size of about 2–10 microns on a substrate, on which undercoat layer there is the silver halide emulsion layer.

14. The method according to claim 1, in which the silver halide emulsion layer contains fine particles having a particle size of about 2–10 microns.

15. The method according to claim 13, in which the fine particles are silica particles.

16. The method according to claim 14, in which the fine particles are silica particles.

17. The method according to claim 1, in which the silver halide emulsion is a direct positive type emulsion.

18. The method according to claim 1, in which between the development and the treatment with the solvent for silver halide and the organic mercapto or thion compound there is removed a silver halide of undeveloped portions by fixing, and rehalogenated metallic silver of developed portions.

19. The method according to claim 1, including simultaneously treating the developed material with at least one solvent for silver halides and at least one organic mercapto or thion compound.

20. A lithographic printing plate made according to claim 1.

* * * * *